US 6,714,776 B1

(12) United States Patent
Birleson

(10) Patent No.: US 6,714,776 B1
(45) Date of Patent: Mar. 30, 2004

(54) SYSTEM AND METHOD FOR AN IMAGE REJECTING SINGLE CONVERSION TUNER WITH PHASE ERROR CORRECTION

(75) Inventor: Stanley Vincent Birleson, West Tawakoni, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 09/407,734

(22) Filed: Sep. 28, 1999

(51) Int. Cl.$^7$ .................................................. H04B 1/12
(52) U.S. Cl. ....................... 455/302; 455/304; 455/315; 455/324
(58) Field of Search .............................. 455/296, 302, 455/303, 304, 310, 311, 324, 315, 209; 375/346

(56) References Cited

U.S. PATENT DOCUMENTS

| | | | |
|---|---|---|---|
| 4,476,585 A | * 10/1984 | Reed .......................... | 455/209 |
| 4,581,643 A | 4/1986 | Carlson | |
| 4,584,710 A | * 4/1986 | Hansen ........................ | 455/304 |
| 4,726,072 A | 2/1988 | Yamashita et al. | |
| 4,742,566 A | 5/1988 | Nordholt et al. | |
| 4,814,715 A | * 3/1989 | Kasperkovitz ............... | 329/50 |
| 4,953,182 A | * 8/1990 | Chung ........................ | 455/324 |
| 4,979,230 A | 12/1990 | Marz | |
| 5,038,404 A | 8/1991 | Marz | |
| 5,060,297 A | 10/1991 | Ma et al. | |
| 5,140,198 A | 8/1992 | Atherly et al. | |
| 5,200,826 A | 4/1993 | Seong | |
| 5,303,417 A | 4/1994 | Laws .......................... | 455/314 |
| 5,311,318 A | 5/1994 | Dobrovolny | |
| 5,321,852 A | 6/1994 | Seong | |
| 5,371,902 A | * 12/1994 | Marz .......................... | 455/304 |
| 5,390,346 A | 2/1995 | Marz | |

(List continued on next page.)

FOREIGN PATENT DOCUMENTS

| | | | |
|---|---|---|---|
| EP | 0305603 A | 3/1989 | ............ H03D/1/22 |
| EP | 0883237 A | 12/1998 | ............ H03D/3/00 |
| GB | 2296613 A | 7/1996 | ............ H03D/7/18 |

OTHER PUBLICATIONS

Meyer, Robert G. "A 1–GHz BiCMOS RF Front–End IC." IEEE Journal of Solid–State Circuits; vol. 29 No. 3 (Mar. 1994): 350–355.

(List continued on next page.)

*Primary Examiner*—Nay Maung
*Assistant Examiner*—Philip J. Sobutka
(74) *Attorney, Agent, or Firm*—Fulbright & Jaworski L.L.P.

(57) ABSTRACT

A system and method for a single conversion tuner which generally uses phase shifted in-phase and quadrature-phase signal paths as an image rejection circuit. Through the use of broadband input LNA and mixer circuits, substantially the entire input signal bandwidth may be processed in the tuner. The broadband input LNA may pass the signal through to the mixers, which may split the signal into in-phase and quadrature terms. Then the in-phase term may be shifted by plus 45 degrees and the quadrature may be shifted by minus 45 degrees. When the terms are subsequently summed together, the desired signal components add together, while the undesired image components subtract from each other. In this way the image signal is suppressed, thus generally eliminating the need for a notch filter. A phase error correction feedback loop may be implemented to compensate for errors between the separate circuit paths. The feedback loop may use a test signal to monitor the phase error between the in-phase and quadrature circuit paths, and may correct for the phase error by shifting the phase of the LO signal sent to one or both of the broadband mixers. The feedback loop thus generally corrects for any phase errors introduced by the image rejection circuitry. The test signal preferably comprises two test tones located slightly out of band from and on either side of the image channel.

87 Claims, 3 Drawing Sheets

U.S. PATENT DOCUMENTS

| | | | |
|---|---|---|---|
| 5,400,363 A | * | 3/1995 | Waugh et al. ................ 375/80 |
| 5,428,836 A | | 6/1995 | Sanecki et al. |
| 5,563,545 A | | 10/1996 | Scheinberg |
| 5,870,670 A | * | 2/1999 | Ripley et al. ............... 455/304 |
| 5,950,119 A | * | 9/1999 | McGeehan et al. ......... 455/302 |
| 5,994,955 A | | 11/1999 | Birkeland |
| 6,268,778 B1 | | 7/2001 | Mucke et al. |
| 6,285,865 B1 | | 9/2001 | Vorenkamp et al. |
| 6,304,751 B1 | * | 10/2001 | King ...................... 455/302 X |

OTHER PUBLICATIONS

Kinget, Peter and Michiel Steyaert. "A 1 GHz CMOS Upconversion Mixer". IEEE Custom Integrated Circuits Conference. (1996) 197–200.

Crols, Jan, and Michel S. J. Steyaert. "A 1.5 GHz Highly Linear CMOS Downconversion Mixer." IEEE Journal of Solid–State Circuits. vol. 30 No. 7 (Jul. 1995). 736–742.

Kuhn, William B., William Stephenson, and Aicha Elshabini–Riad. "A 200 MHz CMOS Q–Enhanced LC Bandpass Filter." IEEE Journal of Solid–State Circuits. vol. 31 No. 8 (Aug. 1996). 1112–1122.

Razavi, Behzad, Kwing F. Lee, Ran–Hong Yan, and Robert G. Swartz. "A 3–GHz 25–mW CMOS Phase–Locked Loop." 1994 Symposium on VLSI Circuits Digest of Technical Papers. (1994). 131–132.

McGinn, Mike. "An Advanced I.F. Amplifier & AFT System Suitable for HDTV." IEEE Transactions on Consumer Electronics. vol. 36 No. 3 (Aug. 1990) 407–414.

Okanobu, Taiwa, Hitoshi Tomiyama, and Hiroshi Arimoto. "Advanced Low Voltage Single Chip Radio IC." IEEE Transactions on Consumer Electronics . vol. 38 No. 3. (Aug. 1992) 465–475.

Crols, Jan, and Michiel Steyaert. "An Analog Integrated Polyphase Filter for a High Performance Low–IF Receiver." 1995 Symposium on VLSI Circuits Digest Of Technical Paper. (1995) 87–88.

Anadigics, Inc. CATV/TV/Cable Modem Upconverter MMIC. Warren NJ (Apr. 22, 1998).

Anadigics Inc. VHF/UHF CATV/TV Tuner Downconverter. Warren, NJ. (Apr. 22, 1998).

Anadigics, Inc. Anagics Technical Brief. Upconverter MMIC for CATV Preliminary. Warren, NJ. (Jan. 11, 1994).

Archer, John, and John Granlund, and Robert E. Mauzy. "A Broad–Band UHF Mixer Exhibiting High Image Rejection over a Multidecade Baseband Frequency Range." IEEE Journal of Solid–State Circuits, vol. SC–16 No. 4 (Aug. 1981) 385–392.

"Double–balanced mixer and oscillator" Phillips Semiconductors. (Nov. 7, 1997). 1–11.

Gilbert, Barrie. "Demystifying the Mixer" Analog Devices Inc. (Apr. 1994). 1–58.

Kuhn, Wiliam B. "Design of Monolithically Integrated Radio Transceivers" Kansas State University.

Sato, Akihiro, et al. "Development of an Adjustment Free Audio Tuner IC" IEEE Transactions on Consumer Electronics, vol. 42 No. 3. (Aug. 1996). 328–334.

Scheinberg, N., et al. "A GaAs Up Converter Interated Circuit for a Double Conversion Cable TV "Set–Top" Tuner" International Conference on Consumer Electronics. (Jun. 1993). 108–109.

Maier, G.M., et al. "Double Conversion Tuner a Must for the Future?" IEEE Transaction on Consumer Electronics, vol. 38, No. 3. (Aug. 1992). 384–388.

Moloney, Daniel M., et al. "Expanded Bandwidth Requirements in CATV Applications." NCTA Technical Papers. (1992). 200–206.

Muller. J–E., et al. "A Double–Conversion Broad Band TV Tuner with GaAs ICs." CaAs IC Symposium Technical Digest. (1984). 97–98.

Nakatsuka, T., et al. , "Low Distortion and Low Noise Oscillator Mixer for CATV Converters." GaAs Symposium Technical Digest. (1988). 161–164.

Brady, Vernon, et al. "Development of a Monolithic FET Ka–Band Single Side Band UFConverter and Image Reject Downconverter." GaAs Symposium Technical Digest (Oct. 1989) 189–192.

Ablassmeier, Ulrich, et al. "GaAs FET Upconverter for TV Tuner" IEEE Transactions on Electron Devides, vol. ED–27, No. 6. (Jun. 1980). 1156–1159.

Pratt, William J. "High Linearity HBT Amplifier Targets Multicarrier Systems" RF Design. (Mar. 1996). 47–54.

Pandula, Louis. "Image Reect and Image Canceling Mixers" RF Design. (Apr. 1995). 60–65.

Leffel, Michael. "Intermodulation Distortion in a Multi–Signal Environment" RF Design (Jun. 1995). 78–84.

Giles, Martin. "The LM 1823: A High Quality TV Video I.F. Amplifier and Synchronous Detector for Cable Receivers." National Semiconductor Corporation. (Mar. 1985). 1–16.

Svelto, F., et al. "A Low–Voltage Topology After CMOS RF Mixers." IEEE Transactions on Consumer Electronics., vol. 45, No. 2 (May 1999). 299–309.

Otaka, Shoji, et al. "A Low Local Input Power 1.9 GHz Si–Bipolar Quadrature Modulator without Any Adjustment." Bipolar/BiCMOS Circuits and Technology Meeting. (1994). 171–174.

Gilbert, Barrie. "The MICROMIXER: A highly Linear Variant of the Gilbert Mixer using a Bisymmetric Class–AB Input Stage" IEEE Journal of Solid–State Circuits, vol. 32, No. 9, (Sep. 1997). 1412–1423.

Ducourant, Thierry, et al. "A 3 Chip GaAs Double Conversion TV Tuner System with 70 db Image Rejection." Monolithic Circuits Symposium Digest of Papers. (1988). 87–90.

Torji, K., et al. "monolithic Integrated VHF TV Tuner." IEEE Transactions on Consumer Electronics, vol. CE–26. (May 1980). 180–189.

Altes, Stephen K., et al. "Monolithic RC All–Pass Networks with Constant–Phase –Difference Outputs." IEEE Transactions on Microwave Theory and Techniques, vol. MTT–34, No. 12. (Dec. 1986). 1533–1537.

MC13143: Ultra Low Power DC–2.4 GHz Linear Mixer. Motorola, Inc. Issue 2. (1996). 1–8.

HP 8561A and HP 8562A/B Portable Spectrum Analyzers. Hewlett–Packard. (Jul. 1989).

MC44302: Advanced Multi–Standard TV Video/Sound IF. Motorola, Inc. (Jun. 17, 1994).

"NCTA Reccomended Practices for Measurements on Cable Television Systems." National Cable Television Association. 2nd Ed. (1993). 1–13.

Maier, Gerd M. "New System Approach to TV Tuner Design." IEEE Transactions on Consumer Electronics, vol. 36, No. 3. (Aug. 1990). 403–406.

Yoshida, Tetsuo. "Polyphase Network Calculation using a Vector Analysis Method." Seta, Setagaya–ku (Jun. 1995).

Koullias,Iconomos, A., et al. "A 900MHz Transceiver Chip Set for Dual–Mode Cellular Mobile Terminals." IEEE International Solid–State Circuits Conference. (1993). 140–141.

McDonald, Mark D. "A 2.5GHz BiCMOS Image–Reject Front–End" IEEE International Solid–State Circuits Conference. (1993). 144–145.

Lovelace, David, et al. "Silicon Upconverter RF IC Simplifies Cable Modem Designs" Microwaves & RF (Mar. 1997). 136–142.

Lovelace, David, et al. "Innovative Simulator Models Silicon Upconverter RF IC" Microwaves & RF. (Apr. 1997). 106–109.

Farmer, James O. "Specifications for Tuner Design for use in Cable Ready Television Receivers and VCRs." IEEE Transactions on Consumer Electronics, vol. 36, No. 3,. (Aug. 1990). 660–668.

Abidi, Asad A. "Direct–Conversion Radio Transceivers for Digital Communications." IEEE International Solid–State Circuits Conference. (1995). 186–187; 363–364.

Kimura, Katsuji. "The Ultra–Multi–Tanh Technique for Bipolar Linear Tansconductance Amplifiers." IEEE Transactions on Circuits and Systems—1: Fundamental Theory and Applications. vol. 44, No. 4. (Apr. 1997). 288–302.

AI–Hashimi, Bashir. "Understand the Fundamentals of Passive Video Filters." Microwaves & RF. (May 1996). 171–178.

Crols, Jan and Michiel Steyaert. "A Fully integrated 900MHz CMOS Double Quadrature Downconverter" IEEE International Solid–State Circuits Conference. (1995). 136–137.

Long, John R., et al. "A Low–Voltage Silicon Bipolar RF Front –End for PCN Receiver Applications." IEEE International Solid–State Circuits Conference. (1995). 104–105; 140–141.

Sabin, William E. & Edgar O. Schoenike. "Single –Sideband Systems & Circuits." McGraw Hill Book Company. New York. (1987). 88–134, 181–213.

John Wetherell, Internet Web Site:http://seoul.eecs.berkeley.edu/~wetherel/rsrch.html, Oct. 21, 1996.

PCT Search Report mailed Feb. 27, 2001 (PCT/US00/41014).

* cited by examiner

SYSTEM AND METHOD FOR AN IMAGE REJECTING SINGLE CONVERSION TUNER WITH PHASE ERROR CORRECTION

TECHNICAL FIELD

This invention relates generally to tuners, and more specifically to a system and method for a tuner which uses a single conversion to reduce a radio frequency input to a standard intermediate frequency signal.

BACKGROUND

Television tuners generally convert a radio frequency ("RF") input into a standard intermediate frequency ("IF") signal in preparation for further processing of the signal. Standard television sets typically use single conversion tuners to perform the conversion, while higher performance systems, such as set top boxes, typically use dual conversion tuners to perform the conversion. In the prior art, dual conversion tuners generally provide higher performance, but use more components and are more expensive than single conversion tuners. Although single conversion tuners generally provide lower performance than dual conversion tuners, single conversion tuners are desirable in that they generally use less parts and are less expensive. For example, a single conversion tuner uses only a single phase lock loop for providing a single local oscillator ("LO") reference signal, as opposed to a dual conversion tuner, which requires two LOs. As another example, a single conversion tuner uses only a single IF filter and mixer for the conversion, whereas a dual conversion tuner requires two IF filters and two mixers for the conversion.

Prior art single conversion tuners are generally designed to process a narrow range of frequencies at any one time. This is accomplished through the use of a tracking filter on the front end of the tuner. As the receiver is tuned across the frequency band during a channel change, the tracking filter is tuned to allow only a few channels to pass into the tuner. As a result, the tuner circuit has to provide good response characteristics for only a few channels at a time, instead of over substantially the entire bandwidth. For example, in a cable television system the tuner would allow only a few channels to enter the receiver front end, instead of the full 100 or more channels in the total cable set. The cable channels may be at full strength of about 15 dBmV. The tracking filter beneficially reduces the dynamic range required in the front end of a conventional receiver.

There are several problems, however, associated with using a tracking filter in prior art single conversion tuners. Sometimes the tracking filter is located after an input low noise amplifier ("LNA"), which controls the input signal level, but more typically the tracking filter is divided into two sections, one part preceding the LNA and a second part following the LNA. The tracking filter generally must track the input frequency as the tuner is being tuned, and it is difficult to maintain good flatness, bandpass and signal rejection characteristics across the entire band.

In addition, in a single conversion tuner the LO is generally in-band, in that it is inside the frequency range of the overall number of channels received by the tuner. For example, if the tuner is tuned to channel 2 at 55.25 MHZ, the LO frequency is 45.75 MHZ above that, and the image frequency is located 45.75 MHZ above the LO. Therefore any undesired input which is in-band around that frequency (within about 6 MHZ) will pass through and be put on top of the desired signal. Therefore a tracking filter generally requires the use of a notch filter for suppressing the image frequency. This bandpass and rejection network which tracks the input and rejects the image frequency is undesirable because of its limited performance. In contrast, dual conversion tuners generally do not require the tracking filter or the notch filter.

A further disadvantage of having an in-band LO is that the oscillator frequency may leak out of the tuner into the broadcast medium. This may be especially problematic in a cable system, where the leaked LO signal may corrupt another channel where the LO is present.

Furthermore, the bandpass and rejection network generally requires relatively high voltage varactors to tune the network. Single conversion tuners thus typically require about 28 or 32 volts for the proper tuning of the bandpass and rejection network in the front end. This high voltage supply requirement is another undesirable feature of prior art single conversion tuners. Quite often, the tuning range of the varactors requires dividing the RF input spectrum into multiple bands. Typically, the input tracking filter is divided into three sections, as described in U.S. Pat. No. 4,598,425 entitled All-channel Television Tuning System, which patent is incorporated herein by reference.

SUMMARY OF THE INVENTION

There is therefore a need for a tuner with the benefits of a single conversion tuner, e.g., lower cost, along with the higher performance of a dual conversion tuner.

These and other objects, features and technical advantages are achieved by a system and method for a single conversion tuner which generally does not require a front end tracking filter. Through the use of broadband input LNA and mixer circuits, substantially the entire input signal bandwidth may be processed in the tuner. The broadband input LNA may pass the signal (together with the image) through to the mixers, which may split the signal into in-phase ("I") and quadrature-phase ("Q") terms. Then the in-phase term may be shifted by plus 45 degrees and the quadrature-phase term may be shifted by minus 45 degrees. When the terms are subsequently summed together, the relative phase shifts cause the desired signal components to add together and the undesired image components to subtract from each other. In this way the image signal is suppressed, thus generally eliminating the need for a notch filter.

Because the signal is split and each portion travels through a separate circuit path, differences in the circuit paths, such as unmatched circuit components, may introduce errors, such as phase errors, when the signal components are subsequently combined. Therefore an error correction feedback loop may be implemented to compensate for these errors. The feedback loop may use a test signal to monitor the phase error between the in-phase and quadrature circuit paths, and may correct for the phase error by shifting the phase of the LO signal sent to one or both of the broadband mixers. The feedback loop thus generally corrects for any phase errors introduced by the image rejection circuitry.

A single conversion tuner in accordance with the present invention comprises image rejection circuitry comprising separate I and Q signal paths, wherein the I and Q signals are phase shifted and summed to substantially cancel an image channel from the signals, and phase error correction circuitry for measuring a phase error between the I and Q signal paths and adjusting the relative phase of the I and Q signal paths to substantially remove the phase error. The tuner may further comprise an injection test signal comprising first and second test tones, the first test tone having a frequency slightly lower and out of band from the image channel, and the second test tone having a frequency slightly higher and out of band from the image channel, wherein error measurements generated by the first and second test tones are averaged together to correct the phase error.

A single conversion method of converting a received RF signal into an IF output signal in accordance with the present invention comprises splitting the received RF signal into separate I and Q signal components, phase shifting the I and Q signal components, summing the I and Q signal components to generate the IF output signal, wherein an image channel is substantially canceled from the IF output signal, measuring a phase error between the I and Q signal components; and adjusting the relative phase of the I and Q signal components to substantially remove the phase error. The method may further comprise an injection test signal comprising first and second test tones, the first test tone having a frequency slightly lower and out of band from the image channel, and the second test tone having a frequency slightly higher and out of band from the image channel, wherein error measurements generated by the first and second test tones are averaged together to correct the phase error.

A technical advantage of one aspect of the present invention is that a single conversion tuner may be implemented with performance characteristics similar to those of a dual conversion filter.

Another technical advantage of one aspect of the present invention is that a tuner input signal may be split into its I and Q components, shifted in phase, and recombined to enforce the desired signal while suppressing the image signal.

Another technical advantage of one aspect of the present invention is that a phase error correction feedback loop substantially eliminates any phase error differences introduced by the separate I and Q signal paths.

Another technical advantage of one aspect of the present invention is that a front end tracking filter for limiting the input signal bandwidth is not required. Another technical advantage of one aspect of the present invention is that a notch filter for removing the image signal is not required.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
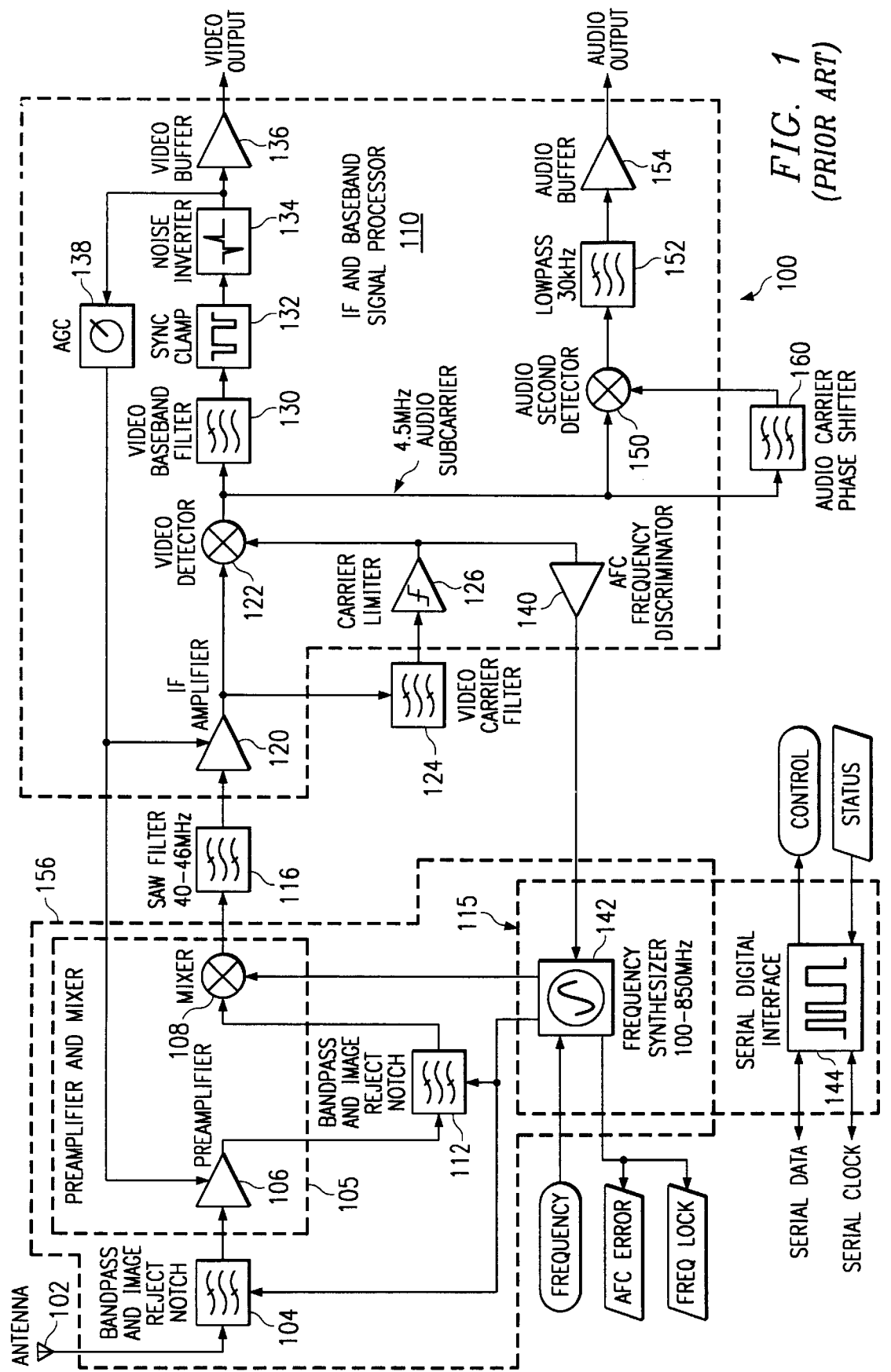
FIG. 1 is a high level block diagram of a prior art single conversion tuner.

FIG. 1 depicts a high level electrical block diagram of a prior art single conversion tuner and demodulator, which have generally become known in the industry as "multimedia tuners." Such a multimedia tuner is simply referred to as a "tuner" herein. Television tuner 100 is constructed in a single metallically shielded assembly containing a printed circuit board on which all of the associated tuner components are mounted and electrically connected. TV tuner 100 is designed to be a module mounted on other printed circuit boards to allow for direct connection of the input and output signals to their appropriate terminations within the television receiving system. The metal shield is used to keep undesired external signals from interfering with the operation of the TV tuner 100 and to prevent TV tuner 100 from radiating signals that interfere with the operation of external devices.

Prior art television tuner 100 comprises three integrated circuits: preamplifier and mixer 105, IF and baseband signal processor 110 and frequency synthesizer and InterIntegrated Circuit ("IIC" or "I$^2$C") bus interface 115. Television tuner 100 also comprises a plurality of discrete components, including bandpass and image reject notch filter 104, bandpass and image reject notch filter 112, surface acoustic wave ("SAW") filter 116, video carrier filter 124, and audio carrier phase shifter 160.

Television tuner 100 receives a standard television RF signal from either antenna 102 or a cable system connection (not shown) through bandpass and image reject notch filter 104. The tracking and image reject notch filters of 104 limit the signals entering TV tuner 100 so that a minimum number of undesired signals exist in TV tuner 100. Filter 104 therefore limits the image response caused by the first mixer, described in more detail below. Filter 104 also attenuates signals not in a fairly narrow (100 MHZ) range about the desired signal. Finally, known interference signals, such as FM broadcast, shortwave service signals, signals in the intermediate frequency band and Citizen Band radio signals, are specifically rejected by filter 104.

Preamplifier 106 of preamplifier and mixer 105 receives the output of bandpass and image reject notch filter 104 and raises the signal level (10 dB) with minimum increase in the noise level (typically 8–10 dB). The gain of preamplifier 106 is controlled by automatic gain control ("AGC") 138, so that when a very strong signal enters TV tuner 100, overall gain is reduced, resulting in less distortion in the preamplifier than without the gain reduction.

The output of preamplifier 106 is sent to bandpass and image reject notch filter 112, with the same basic requirement of minimizing the passage of potential interference signals. Filter 112 is external to preamplifier and mixer 105 and comprises a plurality of discrete elements, including capacitors, inductors and varactor diodes.

The output of bandpass and image reject notch filter 112 is then sent back to mixer 108 in preamplifier and mixer 105. Mixer 108 mixes the output of filter 112 with the output of a local oscillator, frequency synthesizer 142, which has a frequency chosen to be higher than the desired receiver carrier by 45.75 MHZ. Thus, the output of mixer 108 is 45.75 MHZ. There also is an image signal due to mixer 108 at 91.5 MHZ above the input frequency, which is removed by filter 104 and filter 112. Therefore, as the frequency of frequency synthesizer 142 is tuned to receive signals of different carrier frequencies, the bandpass and image reject filters 104 and 112 must also be tuned to properly pass only the desired signals and not the mixer images.

Frequency synthesizer 142 receives an input frequency reference signal (usually 16 bits) and outputs the status signals AUTOMATIC FREQUENCY CONTROL ("AFC") ERROR and FREQUENCY ("FREQ") LOCK. Additionally, a tuning signal which is used by the voltage controlled oscillator ("VCO") in frequency synthesizer 142 is output from frequency synthesizer 142 to bandpass and image reject notch filters 104 and 112. A local oscillator signal is output from frequency synthesizer 142 to mixer 108.

The 45.75 MHZ output signal of mixer 108 then passes through SAW (surface acoustic wave) filter 116, which limits the bandwidth of the signal to only one (1) channel (6 MHZ for NTSC standard) and applies a linear attenuation in frequency known as the Nyquist slope around the visual carrier frequency. The linear attenuation by SAW filter 116 converts the signal from a vestigial sideband signal to one which is equivalent to a single sideband with a carrier, so that the frequency response of the signal after demodulation is flat over the video bandwidth. SAW filter 116 is very "lossy" (on the order of 25 dB), so the input to SAW filter 116 is amplified by a preamplifier (not shown) by a corresponding amount to minimize noise effects.

The output of SAW filter 116 is input to IF amplifier 120 in IF and baseband signal processor 110. IF amplifier 120 provides most of the overall gain of TV tuner 100 and receives gain control from AGC 148.

The output of IF amplifier 120 is sent to video detector 122 and is also sent off-chip to external video carrier filter 124. This is the stage at which video demodulation is performed. Video detector 122 is essentially a mixer with the local oscillator input connected to the output of video carrier filter 124 through carrier amplitude limiter 126. The output of the carrier limiter 126 is an in-phase representation of the video carrier signal without any modulation applied to it. The output of carrier limiter 126 is received by video detector 122, which mixes the output of carrier limiter 126 with the output of IF amplifier 120.

AFC frequency discriminator 140 is used in the prior art device to detect the difference between the carrier frequency contained in the output of carrier limiter 126 and a known valid carrier frequency reference. The output signal on the output of AFC frequency discriminator 140 is an error signal which is used to drive frequency synthesizer 142 in a direction that will reduce the error between the output of carrier limiter 126 and the known valid carrier frequency reference. The output of the video detector 122 is a baseband video signal combined with several high frequency mixing artifacts. These artifacts are removed by a video baseband filter 130. The output of video baseband filter 130 is fed to synchronization pulse clamp ("sync clamp") 132, which sets the level of the sync pulses to a standard level.

Next, the output of sync clamp 132 is sent to noise invertor 134, which removes large noise spikes from the signal. The output of noise invertor 134 is sent to video buffer 136, which is configured to drive fairly high circuit board impedances of approximately 1000 to 2000 ohms.

The output of noise invertor 134 is also sent to AGC 138, which compares the level of the synchronization pulses to the signal blanking level to measure the incoming signal strength and generates a gain control signal which is used by IF amplifier 120 and RF preamplifier 106 to dynamically adjust the gain of the TV tuner 100 for the correct level at the final output.

The audio signal is an FM signal which follows the same path as the video through video detector 122. At the output of video detector 122, the audio signal appears as a subcarrier at 4.5 MHZ, due to the fact that the audio signal comes into prior art TV tuner 100 4.5 MHZ higher in frequency than the desired video carrier. The audio subcarrier is passed on to an FM quadrature demodulator. The FM quadrature demodulator comprises a mixer, audio second detector 150, and a 90 degree (at 4.5 MHZ) phase shifter, audio carrier phase shifter 160. The output of the audio second detector 150 is a baseband audio signal, which is filtered by lowpass (30 kHz) filter 152 to remove any undesired high frequency components. The output of lowpass filter 152 is finally passed on to audio buffer 154, which drives an audio amplifier that ultimately drives a speaker. Serial digital interface 144 receives SERIAL DATA and SERIAL CLOCK inputs to provide control and update status for the prior art television receiver.

Baseband and image reject notch filters 104 and 112 typically comprise a plurality of capacitors, inductors and varactor diodes. Video carrier filter 124 usually comprises three discrete elements: an inductor and two capacitors. Likewise, audio carrier phase shifter 160 is also comprises an inductor and two capacitors. In addition to the circuit elements shown as discrete components outside of circuit elements 105, 110 and 115 in FIG. 1, other discrete components (not shown) are connected to IF and baseband signal processor 110 and frequency synthesizer 142 for tuning purposes. Frequency synthesizer 142 is typically tuned by several external capacitors, inductors and/or varactor diodes. Video buffer 136 and audio buffer 154 will also typically employ external discrete elements, such as resistors, capacitors and/or transistors. Video baseband filter 130 and low pass filter ("LPF") 152 may also employ external inductors and capacitors.

As disclosed in commonly assigned U.S. Pat. No. 5,737, 035, entitled HIGHLY INTEGRATED TELEVISION TUNER ON A SINGLE MICROCIRCUIT, and co-pending and commonly assigned U.S. patent application Ser. No. 08/904,908, entitled BROADBAND INTEGRATED TELEVISION TUNER, both of which are hereby incorporated by reference herein, a tuner may be partially or completely integrated on a single monolithic integrated circuit substrate. Generally, it is preferable to implement all components on the substrate except for the crystal, the input filter, the IF filters, and the sound filter. Of course, depending on the application, other components may be implemented off-chip, or one or more of the above components may be implemented on-chip. The same principles for integrating the tuner on-chip may be applied to single or dual conversion tuners.

Figure 2:
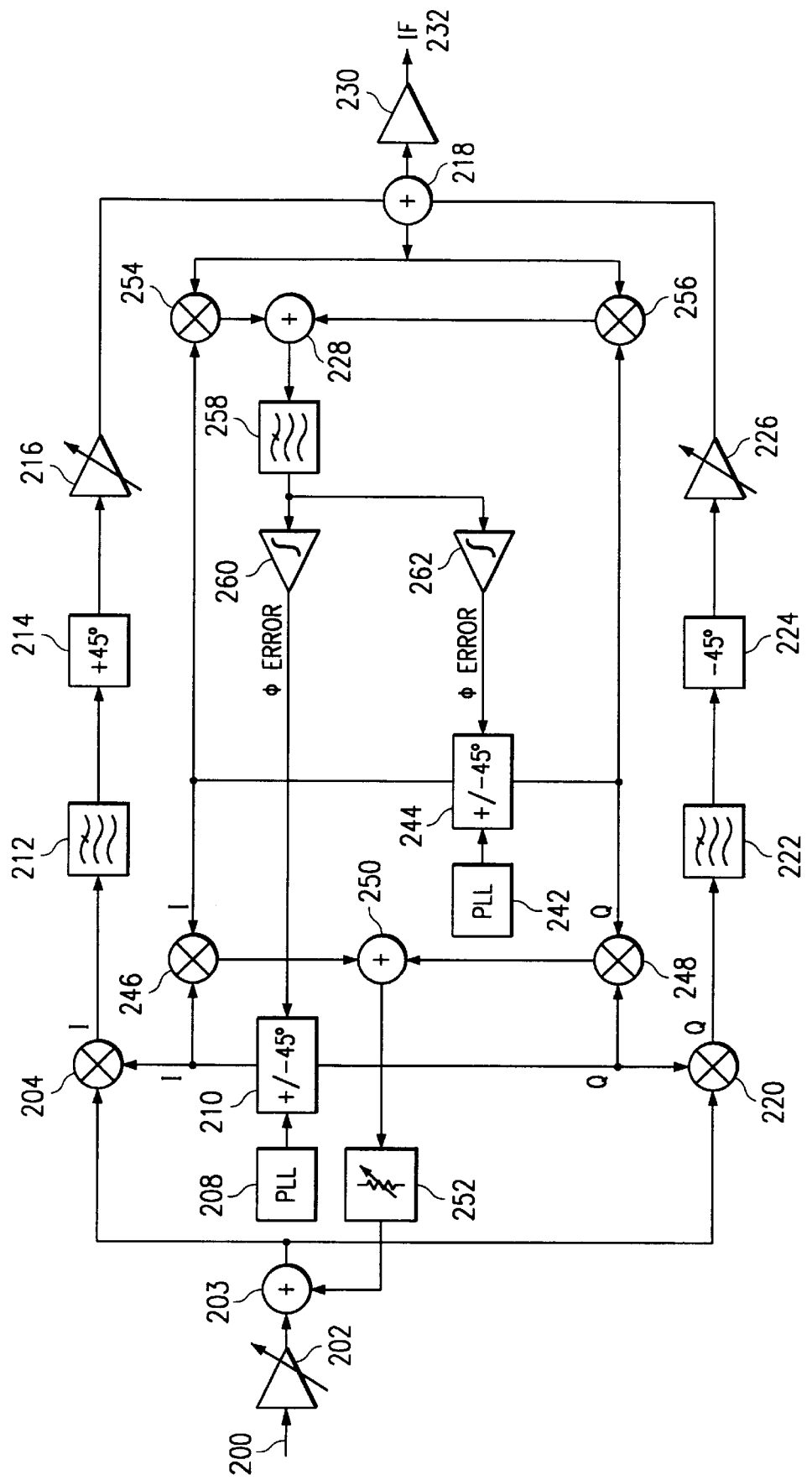
FIG. 2 is a high level block diagram of a single conversion tuner according to the present invention.

FIG. 2 depicts a high level electrical block diagram of a single conversion tuner according to the present invention. The single conversion tuner of FIG. 2 generally replaces the portion of FIG. 1 outlined in block 156. The discussion above corresponding to FIG. 1 and the applications/patents incorporated herein provide additional detailed information for the various similar components used in the inventive single conversion tuner. In addition, the various alternative embodiments discussed in the applications/patents incorporated herein, are generally also applicable to the present invention, along with many other embodiments. For example, the BROADBAND INTEGRATED TELEVISION TUNER specification teaches that multiple tuners may be placed on a single integrated circuit substrate, which concept also applies to the present invention. As another example, the BROADBAND INTEGRATED TELEVISION TUNER specification also teaches that the tuner may be used in many different applications, such as in conventional television receivers and in personal computers, which concept also applies to the present invention. As yet another example, the tuner of the present invention may be used in a cable modem, and may receive any combination of video, voice, and data channels.

In the main single path of the tuner shown in FIG. 2, broadband LNA 202 receives and amplifies RF signal 200 received via coaxial cable from either an antenna or a cable system (not shown). Preferably, the tuner of the present invention is capable of receiving signals compatible with National Television Standards Committee ("NTSC") encoded video. The input frequency bandwidth of the tuner is preferably in the 50–900 MHZ range, and more preferably in the 55–806 MHZ range, for the NTSC standard. Alternatively, the frequency response of the tuner may be compatible with other analog or digital transmission standards such as Phase Alternate Line ("PAL"), Sequential Couleur Avec Memoire ("SECAM"), MTS, Vestigial Side Band ("VSB") (such as 8-VSB), and Coded Orthogonal Frequency Division Multiplexing ("COFDM"). The tuner of the present invention may be used to receive any RF signal band, and the channels in the RF signal band may comprise any type of content, such as video, voice or data.

LNA 202 may be a variable or non-variable gain amplifier. The amplified RF signal from LNA 202 received by input summer 203. The other input to input summer is described hereinafter in the discussion of the phase error correction circuit. The summed signal from input summer 203 is split and sent to broadband mixers 204 and 220.

Phase locked loop ("PLL") 208 is a frequency synthesizer which generates an LO that is provided to LO phase shifter 210. Phase shifter 210 splits the LO into two signals. The first signal is shifted by plus 45 degrees and sent to I signal mixer 204, and the second signal is shifted by minus 45 degrees and sent to Q signal mixer 220. Synthesizers and the generation of LO frequencies is described in detail in co-pending and commonly assigned U.S. patent application Ser. No. 08/904,907, entitled BROADBAND FREQUENCY SYNTHESIZER, which application is hereby incorporated by reference herein. Of course, it is understood that alternative means could be used to generate the LO signal, and such alternative means are within the scope of the present invention.

I signal mixer 204 mixes the output from input summer 203 with the plus 45 degree shifted LO from phase shifter 210 to generate an IF frequency in-phase signal component. Q signal mixer 220 mixes the output from input summer 203 with the minus 45 degree shifted LO from phase shifter 210 to generate a IF frequency quadrature signal component. The outputs from mixers 204 and 220 are then sent through low pass filters 212 and 222, respectively, which filter out the frequencies above the desired IF signals. The output from I signal low pass filter 212 is shifted plus 45 degrees by I signal phase shifter 214, and the output from Q signal low pass filter 222 is shifted minus 45 degrees by Q signal phase shifter 224. The outputs from phase shifters 214 and 224 are then amplified by I signal amplifier 216 and Q signal amplifier 226, respectively. I signal amplifier 216 and Q signal amplifier 226 may be variable or non-variable gain amplifiers. Preferably the order of components 212, 214 and 216 in the I signal path and of components 222, 224 and 226 in the Q signal path is as shown in FIG. 2, although the order of these components may be varied to optimize the performance of the circuit.

Finally, the two signals are combined in IF output summer 218 and then reamplified by IF output amplifier 230 to produce IF output 232. IF output 232 generally provides a standard signal for interfacing to subsequent analog television or other analog circuitry. Standard SAWs and demodulators, such as that illustrated in FIG. 1, may be used to process IF output 232.

By splitting the incoming signal into its I and Q components, which are basically 90 degrees apart, and then adding another 90 degrees of relative phase shift to the signals, the desired signal channel components are effectively placed in phase with each other and the image channel components are placed out of phase with each other. Thus, when the signals are recombined, the desired signal channel is reinforced and the image signal channel is suppressed in IF signal output 232 from output amplifier 230. As can be seen in FIG. 2, the use of broadband components, such as broadband LNA 202, eliminates the need for the input tracking filter used in the prior art. The phase shifting accomplished via the separate I and Q signal paths then suppresses the image signal and eliminates the need for the image rejection notch filter used in the prior art. While it is preferable to not use an input tracking filter and an image reject notch filter, one or both of these filters may still be used in an alternative embodiment of the present invention.

Because the I and Q signal components propagate via separate signal paths, phase errors may be introduced into the signals by differences between corresponding elements in each path. To correct for such phase imbalances, a test signal may be fed into the signal path at input summer 203. The test signal may be summed in as shown in FIG. 2, or may be switched in with a switch in place of input summer 203. Preferably, the test signal frequency is selected to be slightly out of band with respect to the image channel so that the test signal may be present even when the tuner is processing the incoming signal. Because the test signal is out of band, it will be present in the circuit paths shown, but will be suppressed in the SAW filter (not shown) during subsequent processing. Alternatively, the out of band test signal may be switched in when the tuner is not processing the incoming signal.

Figure 4:
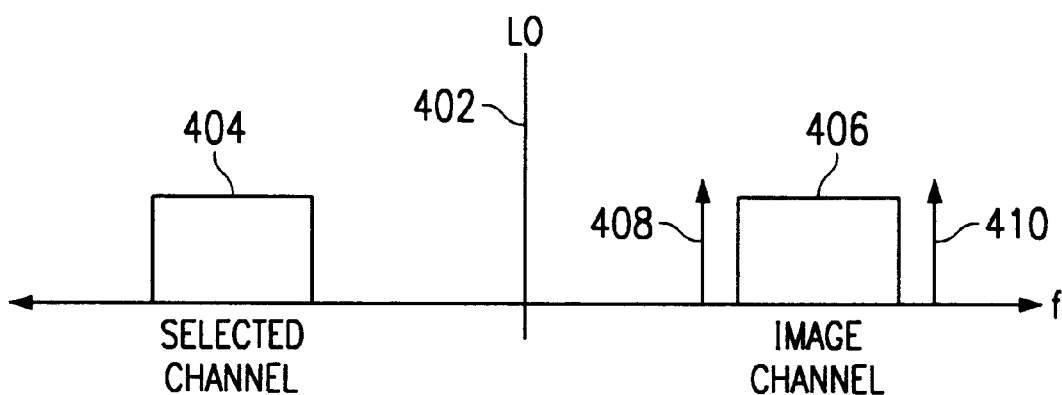
FIG. 4 is a graph illustrating the frequency relationship of the selected channel, the image channel, and the test signals.

Most preferably, the test signal has two components, as shown in FIG. 4. Selected channel 404 and image channel 406 are centered about LO frequency 402. The two components of the test signal are lower test tone 408, which is slightly lower in frequency than image channel 406, and higher test tone 410, which is slightly higher in frequency than image channel 406. The two measured phase errors from the two test tones are averaged together to generate a composite error that is used to minimize the phase error. This preferred embodiment retains the benefit of not interfering with the desired channel, but generally permits a more accurate phase error measurement because the average frequency of the two test signal components is located in band with the image channel. Preferably, the average frequency is located at or near the middle frequency of the image channel. In an alternative embodiment, the test tones may be located slightly on either side of the selected channel instead of the image channel.

In yet another alternative embodiment, the test signal is located in-band with the image channel, but is only injected into the primary signal path when the tuner is not processing an incoming signal, such as during channel selection or a tuning event. In yet another alternative embodiment, the test signal may be injected when the front end is turned off, for calibration of the system without interference from any other signal.

With reference again to FIG. 2, the test signal is generated by a frequency synthesizer such as PLL 242. Preferably, PLL 242 alternately generates two test tones, one slightly lower than the image channel band and one slightly higher than the image channel band. For example, for the NTSC transmission standard, PLL 242 would generate 40 and 48 MHZ test tones. Thus a test signal is provided that is about 1 MHZ below and about 1 MHZ above the NTSC frequencies. As another example, for the PAL transmission standard, PLL 242 would generate 48 and 60 MHZ test tones. The test tones are outside the image channel preferably by between 10 MHZ and 0.1 MHZ, more preferably by between 5 MHZ and 0.2 MHZ, more preferably by between 2 and 0.5 MHZ, and most preferably by about 1 MHZ.

Test signal phase shifter 244 splits the test signal from PLL 242 and shifts the components by plus and minus 45 degrees to form I and Q references, respectively. The I reference is mixed in I test mixer 246 with the plus 45 degree shifted LO signal output from LO phase shifter 210. The Q reference is mixed in Q test mixer 248 with the minus 45 degree shifted LO signal output from LO phase shifter 210. The LO from PLL 208 is preferably tuned to the center of the selected channel, or alternatively to the center of the band, so that mixing it with the IF test signal generates a test RF input after the signals from mixer 246 and mixer 248 are combined by test signal summer 250. The output from test signal summer 250 is therefore alternately a single tone 1 MHZ below and 1 MHZ above the channel that is selected. This signal is set to the proper level by test signal attenuator 252, and then injected into the main signal path via input summer 203.

The test signals then travel down the primary signal paths all the way through amplifiers 216 and 226, where the signals pick up the phase errors between the two primary signal paths. These test signals bearing the phase errors are mixed with the originally split I and Q references from phase shifter 244 in I and Q error signal mixers 254 and 256, which are recombined and passed through low pass filter 258 to remove high frequency components and isolate the error signal. The output of LPF 258 is integrated in primary phase error integrator 260 to create a phase error term which represents the phase error between the two primary signal paths. Based on the phase error, integrator 260 provides a control voltage to LO phase shifter 210, from which the primary LO is provided to primary mixers 204 and 220. The control voltage is used to correct for the measured phase error by shifting the relative phase of the outputs of phase shifter 210 by the measured error. Preferably, the test tones are located near the image channel, and LO phase shifter 210 is adjusted to minimize the test tones and thus minimize the image channel. Alternatively, if the test tones are located near the selected channel, LO phase shifter 210 is adjusted to maximize the test tones and thus maximize the selected channel.

As an example, there may be 10 degrees of error in the separate primary signal paths because of mismatches and imbalances of components in these two paths, due primarily to manufacturing tolerances. The analog voltage from integrator 260, which represents the phase error, is used to adjust the phase shift of the LO provided to one primary signal path by phase shifter 210, thus compensating for the 10 degrees of phase error. Alternatively, each of the LOs to the primary signals paths may be shifted by a portion of the total phase error, such that the sum of the total relative phase shift between the two LOs equals the total phase error. For example, if the phase error is 10 degrees, then one LO may be shifted by +5 degrees and the other LO shifted by −5 degrees, for a total relative shift of 10 degrees.

In an alternative embodiment, the phase error may be corrected by adjusting the relative phase of I signal path phase shifter 214 and Q signal path phase shifter 224, instead of adjusting the phase of LO phase shifter 210.

In a similar manner, based on the measured phase error, test phase error integrator 262 provides a control voltage to test signal phase shifter 244 to shift the relative phase of the I and Q reference signals by the amount of measured phase error. Test signal phase shifter 244 is adjusted to maximize the test tone signal levels.

In operation, the phase error correction circuit preferably alternates between holding either the output of integrator 260 or the output of integrator 262 fixed, while the remaining integrator output is allowed to adjust to correct for the phase error. After a period of time, the integrator output that was allowed to adjust is then held fixed, and the other integrator output is allowed to adjust its phase error correction. In this way, only one of the two correction loops actively closes in on its optimum error correction at a time.

In one preferred embodiment of the present invention, integrators 260 and 262 may retain the latest correction value generated for storage while the test signal is not being run through the primary signal paths. For example, integrators 260 and 262 may each comprise an analog-to-digital converter, a hold circuit for storing the digital value, and a digital-to-analog circuit for converting the digital value back into an analog signal. This would allow a constant correction to be applied even if a test signal is not currently being generated.

While the correction of phase errors has been discussed in detail, there may be other types of errors present in the signal paths, and the correction of these other errors is understood to be within the scope of the present invention. For example, there may be DC offset errors present in the circuit. While other methods may be used, these errors can be corrected simply by inserting AC coupling prior to summation of the I and Q signals in output summer 218. As another example, there may be amplitude imbalances between the two primary signal paths. As a particular example, if there is a different amount of gain between amplifiers 216 and 226, then when the two signals are combined the image signal may not completely cancel out. In any case, a gain correction loop may be used to equalize the gain of the two primary signal paths.

Figure 3:
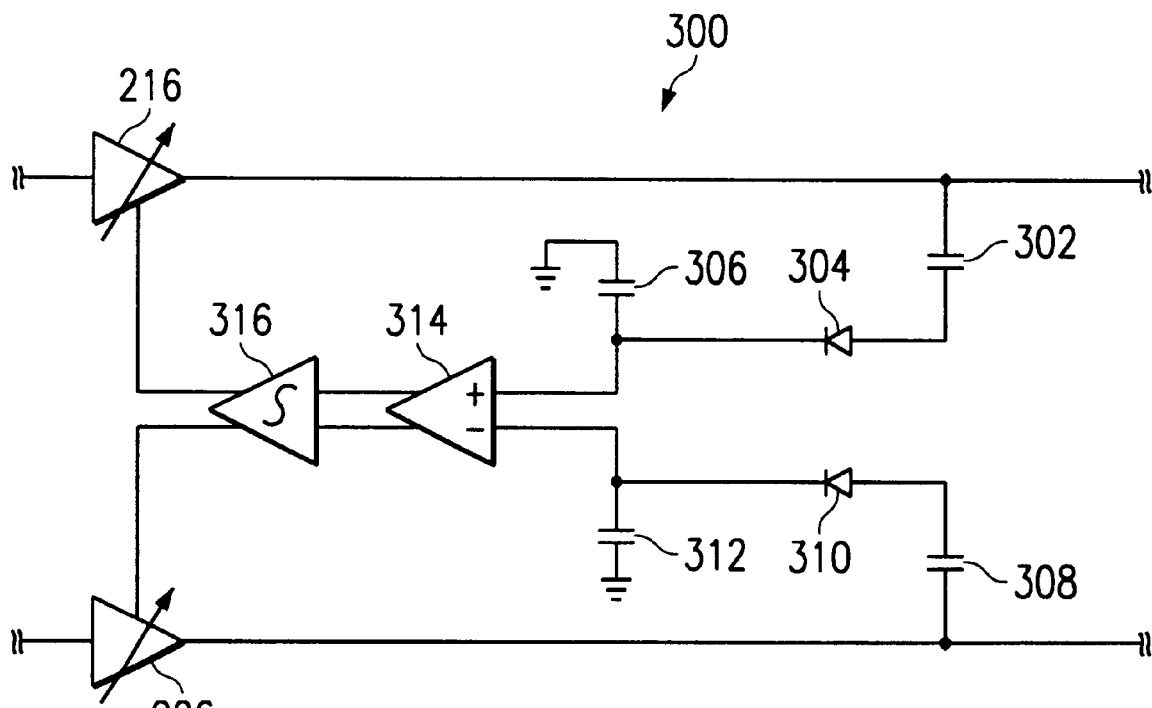
FIG. 3 is a high level block diagram of a gain control circuit for use in the single conversion tuner of the present invention.

The portion of the tuner circuit from FIG. 2 associated with I amplifier 216 and Q amplifier 226 is shown in FIG. 3, together with gain correction loop 300. The output of I amplifier 216 is fed through AC coupling capacitor 302, and then through a peak detection circuit consisting of diode 304 and capacitor 306. Likewise, the output of Q amplifier 226 is fed through AC coupling capacitor 308, and then through a peak detection circuit consisting of diode 310 and capacitor 312. The outputs of the two peak detectors are input into difference amplifier 314, and then into integrator 316. Integrator 316 generates gain control voltages based on the difference in gain detected by the difference amplifier. The gain control voltages are used to adjust the gain of I amplifier 216 and Q amplifier 226 to equalize the gain of the I and Q signal paths. The preferred method is to adjust the gain of both amplifiers differentially, as shown in FIG. 3, because this maintains balanced signal paths. Alternatively, the entire gain error may be corrected by adjusting the gain of only the I amplifier or the Q amplifier alone. The above-described method is just one example of gain correction, and the many other methods of correcting for gain imbalances are understood to be within the scope of the present invention.

Although the present invention and its advantages have been described in detail, it should be understood that various changes, substitutions and alterations can be made herein without departing from the spirit and scope of the invention as defined by the appended claims. For example, ways of rejecting the image channel and correcting for phase error other than those described herein may be implemented, and such embodiments are understood to be within the scope of the present invention. As a more specific example, with respect to phase shifters 210, 214, 224 and 244, it is understood that the relative phase shift between the two signal paths is more critical than the absolute phase shift of each signal path. While the preferred embodiment is shown with the phase shifts applied equally but opposite in the two signal paths (e.g., +45 degrees and −45 degrees) in order to keep the signal paths balanced, the two signal paths may be shifted by any amount individually as long as the total relative phase shift is 90 degrees (e.g., 90 degrees and 0 degrees), and as long as the overall circuit functionality is not detrimentally affected.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A single conversion radio frequency ("RF") tuner for converting a received RF signal into an intermediate frequency ("IF") output signal, said tuner comprising:
    image rejection circuitry comprising separate in-phase ("I") and quadrature-phase ("Q") signal paths, wherein said I and Q signals are phase shifted and summed to substantially cancel an image channel from said signals; and
    phase error correction circuitry for measuring a phase error between said I and Q signal paths and adjusting the relative phase of said I and Q signal paths to substantially remove said phase error, wherein said phase error correction circuitry injects an injection test signal into said I and Q signal paths.

2. The tuner of claim 1 wherein said injection test signal comprises a test tone with a frequency slightly out of band from said image channel.

3. The tuner of claim 1 wherein said injection test signal comprises first and second test tones, said first test tone having a frequency slightly lower and out of band from said image channel, and said second test tone having a frequency slightly higher and out of band from said image channel, wherein error measurements generated by said first and second test tones are averaged together to correct said phase error.

4. The tuner of claim 3 wherein said first and second test tones are located between about 0.2 MHZ and 2.0 MHZ outside a frequency band of said image channel.

5. The tuner of claim 4 wherein said first and second test tones are located about 1 MHZ above and about 1 MHZ below, respectively, said frequency band of said image channel.

6. The tuner of claim 1 wherein said injection test signal is injected into said I and Q signal paths when said tuner is processing said received RF signal.

7. The tuner of claim 1 wherein said injection test signal is injected into said I and Q signal paths when said tuner is not processing said received RF signal.

8. The tuner of claim 1 wherein said injection test signal has a frequency in-band with said image channel.

9. The tuner of claim 2 further comprising an input low noise amplifier passing substantially all channels in an RF band to said image rejection circuitry.

10. The tuner of claim 1 wherein said image rejection circuitry and said phase error correction circuitry are substantially physically located on a single monolithic integrated circuit.

11. The tuner of claim 10 wherein at least one filter used in said tuner is not located on said single monolithic integrated circuit.

12. The tuner of claim 1, wherein said received RF signal is compatible with a format selected from the group consisting of: NTSC, PAL, SECAM, MTS, 8-VSB and COFDM.

13. The tuner of claim 1 wherein at least two tuners are substantially located on a single monolithic integrated circuit.

14. A single conversion radio frequency ("RF") tuner for converting a received RF signal into an intermediate frequency ("IF") output signal, said tuner comprising:
    image rejection circuitry comprising separate in-phase ("I") and quadrature-phase ("Q") signal paths, wherein said I and Q signals are phase shifted and summed to substantially cancel an image channel from said signals; and
    phase error correction circuitry for measuring a phase error between said I and Q signal paths and adjusting the relative phase of said I and Q signal paths to substantially remove said phase error;
    wherein said image rejection circuitry further comprises:
        a primary frequency synthesizer providing a primary local oscillator ("LO");
        a +45 degree LO phase shifter having a input coupled to said LO;
        a −45 degree LO phase shifter having a input coupled to said LO;
        wherein said I signal path further comprises
            an I signal mixer having a first input coupled to said received RF signal and a second input coupled to said +45 degree LO phase shifter; and
            a +45 degree I signal phase shifter having an input coupled to said I signal mixer;
        wherein said Q signal path further comprises
            a Q signal path mixer having a first input coupled to said received RF signal and a second input coupled to said −45 degree LO phase shifter; and
            a −45 degree Q signal path phase shifter having an input coupled to said Q signal path mixer.

15. The tuner of claim 14 wherein said primary frequency synthesizer is a phase locked loop ("PLL").

16. The tuner of claim 14 wherein said I signal path further comprises an I signal low pass filter coupled between said I signal mixer and said +45 degree I signal phase shifter.

17. The tuner of claim 14 wherein said I signal path further comprises an I signal amplifier having an input coupled to said +45 degree I signal phase shifter.

18. The tuner of claim 14 wherein said Q signal path further comprises a Q signal low pass filter coupled between said Q signal mixer and said −45 degree Q signal phase shifter.

19. The tuner of claim 14 wherein said Q signal path further comprises a Q signal amplifier having an input coupled to said −45 degree Q signal phase shifter.

20. The tuner of claim 14 wherein said LO, said phase shifters and said mixers are physically located on a single monolithic integrated circuit substrate.

21. The tuner of claim 14 further comprising an input summer having an output coupled to said I and Q signal mixers, a first input coupled to said received RF signal, and a second input coupled to an injection test signal received from said phase error correction circuitry.

22. The tuner of claim 14 further comprising an input switch having an output coupled to said I and Q signal mixers, a first input coupled to said received RF signal, and a second input coupled to an injection test signal received from said phase error correction circuitry.

23. The tuner of claim 14 wherein said image rejection circuitry further comprises an IF output summer having a first input coupled to +45 degree I signal phase shifter and second input couple to said −45 degree Q signal phase shifter, and a summed IF signal output, wherein said image channel is suppressed in said summed IF signal output.

24. The tuner of claim 23 further comprising an IF output amplifier receiving said summed IF signal output, and providing an amplified IF signal output.

25. The tuner of claim 23 wherein said phase error correction circuitry further comprises:
an injection test signal output coupled to said first inputs of said I and Q signal mixers;
an IF test input coupled to said summed IF signal output; and
a phase error correction signal output coupled to said LO phase shifters, wherein said phase error correction signal shifts the relative phase of said +45 and −45 degree LO phase shifters to compensate for phase errors detected in test signals fed through said I and Q signal paths from said injection test signal output to said IF test input.

26. The tuner of claim 25 wherein said phase error correction circuitry further comprises:
a test signal frequency synthesizer providing a test signal LO;
a +45 degree test signal phase shifter having a input coupled to said test signal LO;
a −45 degree test signal phase shifter having a input coupled to said test signal LO;
an I test mixer having a first input coupled to said +45 degree test signal phase shifter and a second input coupled to said +45 degree LO phase shifter;
a Q test mixer having a first input coupled to said −45 degree test signal phase shifter and a second input coupled to said −45 degree LO phase shifter; and
a test signal summer having a first input coupled to said I test mixer and a second input coupled to said Q test mixer, said test signal summer providing said injection test signal output coupled to said first inputs of said I and Q signal mixers.

27. The tuner of claim 26 wherein said image rejection circuitry and said phase error correction circuitry are substantially physically located on a single monolithic integrated circuit.

28. The tuner of claim 27 wherein at least one filter used in said tuner is not located on said single monolithic integrated circuit.

29. The tuner of claim 26 further comprising a test signal attenuator coupled between said test signal summer and said first inputs of said I and Q signal mixers.

30. The tuner of claim 26 further comprising:
an I error signal mixer having said summed IF signal output as a first input, and a second input coupled to said +45 degree test signal phase shifter;
a Q error signal mixer having said summed IF signal output as a first input and a second input coupled to said −45 degree test signal phase shifter;
an error signal summer having a first input coupled to an output of said I error signal mixer, a second input coupled to an output of said Q error signal mixer, and an output providing a summed phase error signal.

31. The tuner of claim 30 further comprising a low pass filter coupled between said error signal mixers and said LO phase shifters.

32. The tuner of claim 31 further comprising a primary phase error integrator coupled to said low pass filter and providing said phase error correction signal to said LO phase shifters.

33. The tuner of claim 32 further comprising a test phase error integrator coupled to said low pass filter and providing a test phase error correction to said test signal phase shifters.

34. The tuner of claim 33 wherein said image rejection circuitry and said phase error correction circuitry are substantially located on a single monolithic integrated circuit.

35. The tuner of claim 34 wherein at least one filter used in said tuner is not located on said single monolithic integrated circuit.

36. A single conversion method of converting a received RF signal into an IF output signal, said method comprising:
splitting said received RF signal into separate I and Q signal components;
phase shifting said I and Q signal components;
summing said I and Q signal components to generate said IF output signal, wherein an image channel is substantially canceled from said IF output signal;
measuring a phase error between said I and Q signal components, wherein said measuring said phase error further comprises injecting an injection test signal along with said receiving said RF signal; and
adjusting the relative phase of said I and Q signal components to substantially remove said phase error.

37. The method of claim 36 wherein said injection test signal comprises a test tone with a frequency slightly out of band from said image channel.

38. The method of claim 36 wherein said injection test signal is injected at a time when said received RF signal is being processed.

39. The method of claim 36 wherein said injection test signal is injected at a time when said received RF signal is not being processed.

40. The method of claim 36 wherein said injection test signal has a frequency in-band with said image channel.

41. The method of claim 36 wherein said injecting said injection test signal comprises summing said injection test signal with said received RF signal.

42. The method of claim 36 wherein said injecting said injection test signal comprises switching said injection test signal in with said received RF signal.

43. The method of claim 36 further comprising amplifying said received RF signal before said splitting of said received RF signal, wherein said received RF signal comprises substantially all channels in a received RF band.

44. The method of claim 36 wherein said phase shifting further comprises:

phase shifting said I signal component by +45 degrees; and phase shifting said Q signal component by −45 degrees.

45. The method of claim 36 further comprising filtering out high frequencies in said I and Q signal components before said phase shifting.

46. The method of claim 36 further comprising amplifying said IF output signal after said summing.

47. The method of claim 36, wherein said received RF signal is compatible with a format selected from the group consisting of: NTSC, PAL, SECAM, MTS, 8-VSB and COFDM.

48. The method of claim 36 wherein said injection test signal comprises first and second test tones, said first test tone having a frequency slightly lower and out of band from said image channel, and said second test tone having a frequency slightly higher and out of band from said image channel, wherein error measurements generated by said first and second test tones are averaged together to correct said phase error.

49. The method of claim 48 wherein said first and second test tones are located between about 0.2 MHZ and 2.0 MHZ outside a frequency band of said image channel.

50. The method of claim 49 wherein said first and second test tones are located about 1 MHZ above and about 1 MHZ below, respectively, said frequency band of said image channel.

51. The method of claim 36 wherein said splitting further comprises:

mixing said received RF signal with a +45 degree phase shifted LO to generate said I signal component; and mixing said received RF signal with a −45 degree phase shifted LO to generate said Q signal component.

52. The method of claim 51 wherein said LO is generated by a PLL.

53. The method of claim 51 wherein said adjusting of said relative phase further comprises:

shifting the relative phase of said +45 degree and −45 degree phase shifted LOs to compensate for said phase error.

54. The method of claim 36 wherein said splitting, said phase shifting, said summing, said measuring, and said adjusting are substantially performed on a single monolithic integrated circuit.

55. The method of claim 54 wherein at least some signal filtering is performed off of said single monolithic integrated circuit.

56. The method of claim 36 wherein said measuring of said phase error further comprises:

performing said splitting, said phase shifting, and said summing on said injection test signal to generate an IF error signal.

57. The method of claim 56 wherein said measuring of said phase error further comprises:

generating a test signal with a PLL;

phase shifting said test signal by +45 degrees;

mixing said +45 degree phase shifted test signal with said +45 degree phase shifted LO;

phase shifting said test signal LO by −45 degrees;

mixing said −45 degree phase shifted test signal with said −45 degree phase shifted LO; and summing said mixed signals to generate an injection test signal.

58. The method of claim 57 further comprising attenuating said injection test signal before said injecting.

59. The method of claim 57 wherein said splitting, said phase shifting, said summing, said measuring, and said adjusting are substantially performed on a single monolithic integrated circuit.

60. The method of claim 59 wherein at least some signal filtering is performed off of said single monolithic integrated circuit.

61. The method of claim 57 wherein said measuring said phase error further comprises:

mixing said IF error signal with said +45 degree phase shifted test signal to generate an I error signal;

mixing said IF error signal with said −45 degree phase shifted test signal to generate a Q error signal; and summing said I and Q error signals to provide a summed phase error signal.

62. The method of claim 61 further comprising filtering out high frequencies from said summed phase error signal.

63. The method of claim 62 further comprising integrating said summed phase error signal to generate said phase error correction signal for said shifting of said relative phase of said +45 degree and −45 degree phase shifted LOs.

64. The method of claim 63 further comprising integrating said summed phase error signal to generate a test phase error correction signal for shifting the relative phase of said +45 degree and −45 degree phase shifted test signals.

65. The method of claim 64 wherein said splitting, said phase shifting, said summing, said measuring, and said adjusting are substantially performed on a single monolithic integrated circuit.

66. The method of claim 65 wherein at least some signal filtering is performed off of said single monolithic integrated circuit.

67. A single conversion method of processing an RF signal comprising:

receiving said RF signal comprising substantially all channels in an RF band;

splitting said RF signal into an I signal component and a Q signal component, wherein said I signal component comprises an I selected channel and an I image channel, and wherein said Q signal component comprises a Q selected channel and a Q image channel;

phase shifting said I and Q signal components;

summing said phase shifted I and Q signal components to generate an IF output signal comprising said I and Q selected channels, wherein said I and Q image channels are substantially canceled from said IF output signal; and correcting for a phase error between said I signal component and said Q signal component wherein said correcting for said phase error further comprises injecting an injection test signal along with said receiving said RF signal.

68. The method of claim 67 wherein said injection test signal comprises first and second test tones, said first test tone having a frequency slightly lower and out of band from said image channel, and said second test tone having a frequency slightly higher and out of band from said image channel, wherein error measurements generated by said first and second test tones are averaged together to correct said phase error.

69. The method of claim 67 wherein said injection test signal is injected at a time when said received RF signal is being processed.

70. The method of claim 67 wherein said splitting further comprises:

mixing said received RF signal with a +45 degree phase shifted LO to generate said I signal component; and mixing said received RF signal with a −45 degree phase shifted LO to generate said Q signal component.

71. The method of claim 67 wherein said phase shifting further comprises:
   phase shifting said I signal component by +45 degrees; and phase shifting said Q signal component by −45 degrees.

72. The method of claim 67 wherein said splitting, said phase shifting, said summing, said measuring, and said adjusting are substantially performed on a single monolithic integrated circuit.

73. The method of claim 67 wherein said correcting for said phase error further comprises:
   performing said splitting, said phase shifting, and said summing on said injection test signal to generate an IF error signal.

74. The method of claim 73 wherein said correcting for said phase error further comprises:
   shifting the relative phase of said +45 degree and −45 degree phase shifted LOs to compensate for said phase error.

75. The method of claim 67 wherein said measuring of said phase error further comprises:
   generating a test signal with a PLL;
   phase shifting said test signal by +45 degrees;
   mixing said +45 degree phase shifted test signal with said +45 degree phase shifted LO;
   phase shifting said test signal LO by −45 degrees;
   mixing said −45 degree phase shifted test signal with said −45 degree phase shifted LO; and
   summing said mixed signals to generate an injection test signal.

76. The method of claim 75 wherein said correcting for said phase error further comprises:
   mixing said IF error signal with said +45 degree phase shifted test signal to generate an I error signal;
   mixing said IF error signal with said −45 degree phase shifted test signal to generate a Q error signal; and
   summing said I and Q error signals to provide a summed phase error signal.

77. The method of claim 76 further comprising filtering out high frequencies from said summed phase error signal.

78. The method of claim 77 further comprising integrating said summed phase error signal to generate a phase error correction signal for said shifting of said relative phase of said +45 degree and −45 degree phase shifted LOs.

79. The method of claim 78 further comprising integrating said summed phase error signal to generate a test phase error correction signal for shifting the relative phase of said +45 degree and −45 degree phase shifted test signals.

80. A single conversion RF tuner for converting a received RF signal into an IF output signal, said tuner comprising:
   means for splitting said received RF signal into separate I and Q signal components;
   means for phase shifting said I and Q signal components;
   means for summing said I and Q signal components to generate said IF output signal, wherein an image channel is substantially canceled from said IF output signal;
   means for measuring a phase error between said I and Q signal components, wherein said means for measuring said phase error further comprises means for injecting an injection test signal along with said receiving said RF signal; and
   means for adjusting the relative phase of said I and Q signal components to substantially remove said phase error.

81. The tuner of claim 80 wherein said injection test signal comprises first and second test tones, said first test tone having a frequency slightly lower and out of band from said image channel, and said second test tone having a frequency slightly higher and out of band from said image channel, wherein error measurements generated by said first and second test tones are averaged together to correct said phase error.

82. The tuner of claim 80 wherein said injection test signal is injected at a time when said received RF signal is being processed.

83. A single conversion radio frequency ("RF") tuner for converting a received RF signal into an intermediate frequency ("IF") output signal, said tuner comprising:
   image rejection circuitry comprising separate in-phase ("I") and quadrature-phase ("Q") signal paths, wherein said I and Q signals are phase shifted and summed to substantially cancel an image channel from said signals, wherein said image rejection circuitry comprises a primary frequency synthesizer providing a primary local oscillator ("LO") and a LO phase shifter providing a 90° relative phase differential with respect to said LO as provided to said I and Q signal paths; and
   phase error correction circuitry for measuring a phase error between said I and Q signal paths and adjusting the relative phase of said I and Q signal paths to substantially remove said phase error, wherein said phase correction circuitry operates to adjust said LO phase shifter.

84. The tuner of claim 83 wherein said image rejection circuitry and said phase error correction circuitry are substantially physically located on a single monolithic integrated circuit.

85. The tuner of claim 84 wherein at least one filter used in said tuner is not located on said single monolithic integrated circuit.

86. The tuner of claim 83 wherein said phase error correction circuitry injects an injection test signal into said I and Q signal paths.

87. The tuner of claim 86 wherein said injection test signal comprises a test tone with a frequency slightly out of band from said image channel.

* * * * *